United States Patent [19]

Wijeyesekera et al.

[11] Patent Number: 4,999,338
[45] Date of Patent: Mar. 12, 1991

[54] PREPARATION OF METAL/SUPERCONDUCTING OXIDE COMPOSITES

[75] Inventors: Sunil D. Wijeyesekera; Robert H. Heistand, II, both of Midland, Mich.

[73] Assignee: The Dow Chemical Company, Midland, Mich.

[21] Appl. No.: 484,148

[22] Filed: Feb. 23, 1990

[51] Int. Cl.$^5$ .......................................... H01L 39/12
[52] U.S. Cl. ........................................ 505/1; 505/785; 505/915; 419/19; 419/48
[58] Field of Search .......................... 501/1, 915, 785; 419/19

[56] References Cited

U.S. PATENT DOCUMENTS

| | | | |
|---|---|---|---|
| 3,301,643 | 1/1967 | Cannon et al. | 29/195 |
| 3,622,313 | 11/1971 | Havel | 75/226 |
| 3,752,665 | 8/1973 | Roy et al. | 75/135 |
| 4,050,147 | 9/1977 | Winter et al. | 29/599 |
| 4,081,272 | 3/1978 | Adlerborn | 75/223 |
| 4,411,959 | 10/1983 | Braginski et al. | 428/558 |
| 4,428,906 | 1/1984 | Rozmus | 419/48 |
| 4,594,218 | 6/1986 | Dubots et al. | 419/4 |
| 4,656,002 | 4/1987 | Lizenby et al. | 419/10 |
| 4,744,943 | 5/1988 | Timm | 419/10 |
| 4,826,808 | 5/1989 | Yurek et al. | 505/1 |
| 4,826,808 | 5/1989 | Yurek et al. | 505/1 |
| 4,843,059 | 6/1989 | Deslandes et al. | 505/1 |
| 4,892,861 | 1/1990 | Ray | 505/1 |

FOREIGN PATENT DOCUMENTS 1490242 5/1963 Fed. Rep. of Germany.
2646096 10/1976 Fed. Rep. of Germany.

OTHER PUBLICATIONS

R. G. Sharma, "Review on the Fabrication Techniques of A-15 Superconducting", Cyrogenics (1987), vol. 27, No. 7, pp. 361-378.

A. J. J. Stekly, "Superconducting Coils", The Science and Technology of Superconductivity, vol. 2, pp. 497-538 (1973).

Gazit et al., "Preparation of High Temperature Superconductor-Metal Wire Composites," Materials Research Bulletin, vol. 24, pp. 467-474 (1989).

Deslandes et al., "Research of the Effective Role of Silver Additions to $YBa_2Cu_3O_7$", Solid State Communications, vol. 71, No. 5, pp. 407-410 (1989).

S. Jin et al., "Superconductivity in the Bi-Sr-Ca-Cu-O Compounds with Noble Metal Additions", Applied Physics Letters, vol. 52, No. 19, pp. 1628-1630 (1988).

S. X. Dou et al., "Superconductivity in an Ag-Doped Bi-Pb-Sr-Ca-Cu-O System", Applied Physics Letters, vol. 56, No. 5, pp. 493-494 (1990).

T. J. Richardson et al., "Aluminum Cladding of High $T_c$ Superconductors by Thermo-Compression Bonding", Applied Physics Letters, vol. 53, No. 23, pp. 2342-2343 (1988).

Min-Seok Oh et al., "Fabrication and Microstructure of Composite Metal-Clad Ceramic Superconducting Wire", Journal American Ceramic Society, vol. 72, No. 11, pp. 2142-2147 (1989).

D. Shi et al., "Swagged Superconducting Wires", Materials Letters, vol. 7, No. 12, pp. 428-432 (1989).

L. E. Murr et al., "Introducing: The Metal-Matrix High-Temperature Superconductor", Advanced Materials & Processes Inc., Metal Progress, 10/87, pp. 36-44.

L. E. Murr et al., "Fabrication of Metal/High-Temperature Superconductor Composites by Shock Compres-

(List continued on next page.)

Primary Examiner—Stephen J. Lechert, Jr.
Attorney, Agent, or Firm—D. R. Howard

[57] ABSTRACT

Subject a heated, non-molten, intimate admixture of a base metal and a superconducting oxide material to pressure sufficient to form a densified article. The densified article is either superconducting as formed or capable of being rendered superconducting by annealing in the presence of oxygen. Depending upon the choice of materials the densified article is stable at temperatures up to 1000° C.

25 Claims, 3 Drawing Sheets

OTHER PUBLICATIONS sion", *Sampe Journal*, vol. 24, No. 6, pp. 15–18 (Nov./Dec. 1988).

I. Chen et al., *Superconductive News*, pp. 15–16 (Jun. 1988).

A. Goyal et al., "Cermets of the $Y_1Ba_2Cu_3O_{7-\delta}$ Superconductors", *Materials Letters*, vol. 6, No. 8, 9 (May 1988).

R. C. Chan et al., "Superconducting Pastes and Their Applications", *American Ceramic Society, Annual Meeting*, Indianapolis, Ind., Apr. 27, 1989.

Torardi et al., "Crystal Structure of $Tl_2Ba_2Ca_2Cu_3O_{10}$, a 125 K Superconductor", *Science*, vol. 240 (Apr. 29, 1988).

R. J. Cava et al., "Bulk Superconductivity at 91K in Single-Phase Oxygen-Deficient Perovskite $YBa_2Cu_3O_7$", *Physical Review Letters*, vol. 58, No. 16, pp. 1676–1679 (1987).

E. M. Engler et al., "Superconductivity Above Liquid Nitrogen Temperature: Preparation and Properties of a Family of Perovskite-Based Superconductors", Journal American Chemical Society, vol. 109, No. 9, pp. 2848–2849 (1987).

H. Sasakura et al., "Single High $T_c$ Phase Region of the Bi–Pb–Sr–Ca–Cu–O System", *Japan Journal Applied Physics*, vol. 28, No. 7, pp. L1163–L1166 (1989).

R. J. Cava et al., "Superconductivity Near 70 K in a New Family of Layered Copper Oxides", *Nature*, vol. 336, pp. 211–214 (Nov. 17, 1988).

R. J. Cava et al., "Synthesis of Bulk Superconducting $YBa_2Cu_4O_8$ at One Atmosphere Oxygen Pressure", *Nature*, vol. 338, pp. 328–330 (1989).

PREPARATION OF METAL/SUPERCONDUCTING OXIDE COMPOSITES

BACKGROUND OF THE INVENTION

The present invention generally concerns composite materials formed from a superconducting oxide and a metal. The present invention more particularly concerns a process for fabricating high temperature superconductor/metal composite materials as well as the resultant materials.

As used herein, the term "critical temperature" or "$T_c$" refers to that temperature below which the Meissner effect is manifest. The Meissner effect is the expulsion of magnetic flux that occurs when a material is cooled below its superconducting transition. It is considered absolute proof of superconductivity.

Superconductivity, particularly high $T_c$ superconductivity, is the subject of considerable research efforts. Research programs focus upon, among other considerations, means to increase the superconducting transition temperature, understanding reasons and mechanisms for superconductive properties of certain materials and development of new superconducting materials.

A practical limitation on the usefulness of superconducting oxide materials is their lack of ready conversion to fabricated products with mechanical integrity as well as stable superconducting properties. Literature references addressing this limitation consistently maintain that formation of intimate composites of superconductors and metals is essential to use of the superconductors in a variety of applications.

In an article entitled "Review on the Fabrication Techniques of A-15 Superconductors", *Cryogenics*, Vol. 27, No. 7, pages 361–78 (1987), R. G. Sharma describes various processes used to prepare wires of brittle A-15 superconductors such as $Nb_3Sn$ and $V_3Ga$ for use in high field magnetic coils. All of the processes lead to wires in which filaments of superconductor one to ten micrometers are embedded intimately in a metal matrix composed of metals such as copper and bronze. Such a structure is essential to provide stability against disturbances of a electrical, thermal or mechanical nature in the finished part. In addition, metals such as niobium, bronze, tin or copper are used as precursors for the superconductor filaments in order to aid in their fabrication.

In a review article entitled "Superconducting Coils", *The Science and Technology of Superconductivity*, Volume 2, pages 497–538 (1973), Z. J. J. Stekly describes the importance of having metals in intimate contact with the superconductor within a fabricated coil for both ductile and brittle superconductors, including $Nb_3Sn$, NbTi and NbZr. He suggests that criteria for stability of the fabricated coil include small superconductor size and the addition of a conductor with high electrical and thermal conductivity. He provides examples of conducting strands, including NbTi filaments having a diameter of 50 to 100 micrometers.

Braginski U.S. Pat. No. 4,411,959 disclose a superconducting composite wire comprising an encapsulating sheath of ductile conducting metal and encapsulated filaments of essentially contiguous submicron particle superconducting powder. The superconducting powder may be a niobium or vanadium compound such as $Nb_3Ga$ or $V_3Ga$ or a Chevrel phase such as $PbMo_6S_8$. The Powder contains up to 10% by volume of a lubricant.

Dubots U.S. Pat. No. 4,594,218 disclose a multi-step process for making lengths of superconductor from a ternary chalcogenide of molybdenum. In step one, a powder of a chalcogenide of molybdenum is mixed with a powder of a smaller particle size. The powder is chosen from constituents of the chalcogenide, aluminum, silver, gallium, rhenium and titanium. The powder mixture is then sheathed with a metal wall formed from molybdenum, niobium, tantalum, titanium or vanadium. The sheathed mixture is then drawn and cold worked by conventional cable-making techniques to form superconducting lengths. Finally, the superconducting length is heated to a temperature of about 800° Celsius for a period of at least twenty hours.

Roy U.S. Pat. No. 3,752,665 disclose synthesis of superconducting intermetallic compounds by explosive compaction of a stoichiometric powder mixture of the constituent metallic elements. One such compound is $Nb_3Sn$.

Winter U.S. Pat. No. 4,050,147 incorporate fine superconducting particles with a medium diameter of up to 500 Angstroms into a ductile metallic matrix by one of three different methods. The superconducting particles are compounds of niobium or vanadium such as compounds of $A_3B$ with BW, where A is Nb or V and B is Al, Ge, Si, Ga or Sn. One method includes mixing a powdered compound such as $Nb_3Sn$ with a metal powder like copper, compacting the mixed powder, and sheathing the compacted powder in a container of the same metal. The container is evacuated and closed before it is extruded and further drawn into wires.

Cannon U.S. Pat. No. 3,301,643 produce superconducting composite materials comprising a zeolite matrix having atomic size filamentary pores extending throughout and filled with a material capable of being rendered superconductive. One means of preparing such a material involves infusion of molten metal under pressure into a zeolite matrix. An alternate means includes steps of impregnating zeolite particles with a solvent solution containing metal ions and thereafter removing the solvent and reducing the metal ions to free metal. The impregnated particles may then be formed into a composite body of appropriate shape.

DT 2,646,096 discloses preparation of ductile superconducting wire or strip by dispersing superconducting particles in conventional conductor matrix and extruding the resulting coarse granulate. In one example, 10% NbN powder and 90% pure Al powder are milled for 200 hours to provide a granulate with 300 micrometer particle size. The granules are cold pressed into bars then heated and extruded into rods which are subsequently made into wire.

Rosi et al. (DT 1,490,242) disclose superconductors made from two pulverized metal components. One component may be a sintered compound of two superconducting metals, the other either a super- or a normal conducting metal. The two components are pressed together, e.g., with a pressure of 560 kg/cm$^2$ and then annealed in a vacuum, e.g., at 700° C. for two hours.

The teachings of each of the foregoing references focus upon fabricating composites of normal metals with low $T_c$ nonoxide superconductors. These materials, which include such commercial materials as NbTi and $Nb_3Sn$, have an inherent, fundamental limitation in that they have a maximum $T_c$ of 23.5K.

Recent discoveries of a number of oxide superconductors with $T_c$'s as high as 125K provide certain advantages over the low $T_c$ nonoxide superconductors. They can, for example, be cooled more cheaply than the low $T_c$ superconductors. Notwithstanding such advantages, the oxide superconductors also possess at least one shortcoming that poses a formidable challenge to preparing composites of the oxide superconductors with normal metals. That shortcoming is the generally high degree of reactivity between these metals and the superconducting oxides. This reactivity suggests that fabrication of composites or mixtures of high $T_c$ superconducting oxides and normal metals is not a simple extension of the aforementioned techniques used with low $T_c$ nonoxide superconductors. The noble metals, e.g., silver, gold, platinum and palladium, are often suggested as a solution to the reactivity problem.

Yurek U.S. Pat. No. 4,826,808 disclose a superconducting oxide-metal composite in which a noble metal phase is intimately mixed with a superconducting oxide phase to achieve desired mechanical properties. They classify a metal as noble if its oxide is thermodynamically unstable under the reaction conditions employed relative to the superconducting oxide that forms. The noble metal may be a metallic element such as gold, platinum, palladium or silver. The noble metal may also be an excess amount (stoichiometrically) of one of the metallic elements of the oxide, e.g., copper. The composite may, for example, be prepared by alloying the metallic elements of the superconducting oxide with the noble metal and thereafter oxidizing the alloy under conditions sufficient to oxidize the superconducting oxide components but not the noble metal.

Gazit et al., in an article entitled "Preparation of High Temperature Superconductor-Metal Wire Composites", *Materials Research Bulletin*, Vol. 24, pages 467–74 (1989), disclose preparation of composite wires by pulling platinum wires through a melt composed of bismuth superconductors. The superconductors are $Bi_{1.8}Sr_{1.8}Ca_{1.2}Cu_{2.2}O_8$ and $Bi_2Sr_2CaCu_2O_8$. Although these wires are not superconducting, the authors suggest that gold, rhodium or iridium wires should be.

Deslandes et al., in an article entitled "Research of the Effective Role of Silver Additions to $YBa_2Cu_3O_7$", *Solid State Communications*, Vol. 71, No. 5, pages 407–10 (1989), teach that metallic silver additions improve the current carrying capacity of fabricated ceramics by cleaning the grain surfaces.

S. Jin et al., in an article entitled "Superconductivity in the Bi-Sr-Ca-Cu-O Compounds with Noble Metal Additions", *Applied Physics Letters*, Vol. 52, No 19, pages 1628–30 (1988), prepare particle composites of $Bi_4Sr_3Ca_2Cu_4O_{16}$ with gold, silver or platinum by sintering. Only the silver-containing composites are benign. Both gold and platinum-group metals significantly suppress or eliminate the superconducting properties of the fabricated composite.

S. X. Dou et al., in an article entitled "Superconductivity in an Ag-doped Bi-Pb-Sr-Ca-Cu-O System", *Applied Physics Letters*. Vol. 56, No 5, pages 493–94 (1990), describe conditions under which successful particle composites of the title composition can be fabricated by sintering.

Although some success in fabricating metal-superconducting oxide composites is evident from the preceding references, at least two shortcomings remain. First, noble metals are expensive and may cause the resulting composites to be prohibitively expensive. Second, noble metals such as silver and gold are mechanically soft and may not be suitable for all applications. For these reasons, among others, there is considerable interest in encapsulating superconducting oxides in non-noble or base metals such as copper and aluminum.

Two methods are commonly used in an effort to encapsulate superconducting oxides in base metals. One method involves placing the superconducting oxide into a tube formed of a base metal and thereafter fabricating the tube by various techniques such as wire drawing. This method is generically referred to as the "powder in tube" method. The other method includes a step of cladding an already formed superconducting article with a layer of base metal.

T. J. Richardson et al., in an article entitled "Aluminum Cladding of High $T_c$ Superconductors by Thermocompression Bonding", *Applied Physics Letters*, Vol. 53, No.23, pages 2342–43 (1988), disclose the cladding of high $T_c$ oxide superconducting ceramics with aluminum. A two micrometer layer of silver is applied to the ceramic before cladding to reduce reactivity between the superconductor and the aluminum.

Min-Seok Oh et al., in an article entitled "Fabrication and Microstructure of Composite Metal-Clad Ceramic Superconducting Wire", *Journal American Ceramic Society*, Vol. 72, No. 11, pages 2142–47 (1989), disclose the use of the "powder in tube" method where the tube is either pure silver or a thin inner layer of silver covered by a thick wall of stainless steel or nickel. Although the thin inner layer is designed to reduce reaction between $YBa_2Cu_3O_7$ and the base metal, the authors report that the effort is largely unsuccessful. They find considerable evidence of a reaction which destroys most, if not all, of the superconductivity.

D. Shi et al., in an article entitled "Swagged Superconducting Wires", *Materials Letters*, Vol. 7, No. 12, pages 428–32 (1989), disclose a "powder in tube" method where the tube is made of copper. The copper tube is, however, removed prior to fabricating a wire in an effort to reduce reactivity between the copper and the superconducting oxide. As such, the final fabricated article is no longer a composite.

L. E. Murr et al., in an article entitled "Introducing: The Metal-Matrix High-Temperature Superconductor", Advanced Materials & Processes inc. *Metal Progress* 10/87, pages 36–44, teach that solid cylindrical composites may be prepared by incorporating mixtures of copper powder and cuprate superconducting powders in an arrangement of copper tubes via explosive compaction. The resulting monoliths could be rolled, drawn, or extruded into wire at relatively low temperature. They suggest that other metals might be substituted for the copper powder.

L. E. Murr et al., in an article entitled "Fabrication of Metal/High-Temperature Superconductor Composites by Shock Compression", *SAMPE Journal*, Vol. 24, No. 6, pages 15–18 (Nov./Dec. 1988), disclose a combination of explosive welding and explosive powder consolidation to consolidate, bond and encapsulate reactive and temperamental copper oxide-based, high-$T_c$ superconducting powders in a supporting metal matrix.

The powder in tube technique is, as noted hereinabove, not completely successful due to reactivity between the superconducting oxide and the non-noble or base metal. In addition, the degree of intimacy of contact between the superconductor and the metal is limited to the interface between the surface of a metal layer and the outer surface of the body of powder. In other words, contact between the superconductor and the metal occurs only on a macroscopic level. By way of contrast, contact between the superconductor and the metal in low $T_c$ superconductor composites is much more intimate. The latter composites typically consist of one to ten micrometer filaments of superconductor dispersed in a metal phase. If such a procedure were used with the superconducting oxides, an even greater level of reactivity would be expected.

Notwithstanding an expectation of greater reactivity, some efforts are directed toward duplicating the low $T_c$ composite work for high $T_c$ superconducting oxides.

I. Chen et al., in *Superconductivity News*, pages 15-16 (June 1988), disclose aluminum/silver/123 composites prepared by a conventional powder metallurgy process. They suggest that superconducting materials other than 123 ($YBa_2Cu_3O_{7-x}$) will also work.

A. Goyal et al., in an article entitled "Cermets of the $Y_1Ba_2Cu_3O_{7-\delta}$ Superconductors", *Materials Letters*, Vol. 6, No. 8, 9 (May 1988), describe cermets prepared from intimate mixtures of copper, nickel or tin (15 weight percent of each) with a $YBa_2Cu_3O_7$ superconductor. They suggest that copper and nickel composites are superconducting because of zero resistivity. They do not, however, comment upon the presence or absence of reactivity between the metal and the superconducting oxide.

R. C. Chan et al., in a talk entitled "Superconducting Pastes and Their Applications", *American Ceramic Society, Annual Meeting*, Indianapolis, Ind., Apr. 27, 1989, teach that composites can also be formed by infiltrating liquid tin into porous superconductor preforms. They suggest that the superconducting properties are not detrimentally affected by this technique. This method is, however, limited to low melting base metals due to the general tendency of superconducting oxides to be very reactive with molten base metals. The low melting base metals are usually soft with poor mechanical properties. These properties carry over to the resulting composites.

SUMMARY OF THE INVENTION

One aspect of the present invention is a method for preparing a superconducting ceramic-metal composite article comprising:

a. heating an admixture of a superconducting oxide and a metal to a temperature which is high enough to allow the mixture to be densified under pressure to more than about 80 percent of the admixture's theoretical density but low enough to substantially preclude melting of the admixture or any of its components and minimize adverse reactions between the superconducting oxide and the metal; and b. subjecting said heated admixture to a pressure, preferably isostatic pressure, in excess of 15,000 pounds per square inch (103 megapascals) for a period of time sufficient to form a densified article having a density of greater than about 80% of the admixture's theoretical density.

The process may comprise two additional, sequential steps, a first additional step wherein the densified article is heated in a gaseous atmosphere at a temperature greater than or equal to that of step a for a period of time within a range of from about one hour and about five days, the gaseous atmosphere being inert for non-noble metals, and the second additional step comprising a further heat treatment in an oxygen-containing atmosphere at a temperature high enough to allow uptake of oxygen by the superconducting oxide, but low enough to substantially preclude oxidation of the metal, for a period of time sufficient to attain superconductivity and cause the article to have zero resistance to current flow.

In an alternate embodiment, the first heat treatment is omitted. As such, the densified article resulting from step b is heated in a oxygen-containing atmosphere to a temperature high enough to allow uptake of oxygen by the superconducting oxide, but low enough to substantially preclude oxidation of the metal, and maintained at that temperature for a period of time sufficient to attain superconductivity.

Another aspect of the present invention is a superconducting ceramic-base metal composite (a) having a density greater than or equal to 80 percent of the composite's theoretical density, (b) comprising, based upon composite volume, an intimate admixture of from about 20 to about 95 volume percent superconducting material and from about 5 to about 80 volume percent base metal, (c) being stable at a processing temperature within a range of from about 350° C. to about 900° C., (d) having a critical temperature of 30 K. or greater, and (e) having a zero field cooled magnetic moment of about $-0.5 \times 10^{-3}$ emu/Gauss/gm of superconductor or more negative.

As used herein, the term "metal" refers to pure or elemental metals as well as alloys of one or more pure or elemental metals with or without additional non-metallic elements such as carbon, oxygen and the like.

As used herein, the term "stable" means that the components of the admixture and composite are substantially non-reactive with respect to each other in that reactions which occur do not lead to substantial irreversible decomposition of the superconductor contained in the composite. The lack of reactivity is confirmed by conventional methods of analysis such as differential scanning calorimetry or x-ray diffraction.

As used herein, "irreversible decomposition" means that the cationic framework within the superconductor is altered to such a degree that it cannot be regenerated at temperatures below 500° C.

DESCRIPTION OF PREFERRED EMBODIMENTS

The superconducting oxide is suitably a high temperature superconducting oxide containing copper-oxygen sheets and having an average oxidation number of copper greater than +2. The superconducting oxide is beneficially a high critical temperature superconducting oxide selected from the group consisting of:

$YBa_2Cu_3O_7$, $ReBa_2Cu_3O_{7-\delta}$, $La_{2-x}Ba_xCuO_{4-\delta}$,
$La_{2-x}Sr_xCuO_{4-\delta}$, $Bi_{2-M}Pb_MSr_{2-N}Ca_{K-1-P}Cu_{K-W}O_{2K+4+Y}$,
$Tl_JBa_{2-N}Ca_{K-1-P}Cu_{K-W}O_{2K+J+2+Y}$,
$Tl_aPb_bCa_cSr_dCu_eO_{2(b+c+d+e)+3a+\delta}$, $YBa_2Cu_4O_{8-\delta}$, and
$Pb_2Sr_2Re_{1-Q}Ae_QCu_3O_{8+\delta}$.

wherein $\delta$, N, M, P and W are real numbers greater than or equal to zero and less than or equal to one, Y is a real number greater than zero and greater than or equal to 3K, Q is a real number greater than zero and less than one, J is one or two, K is a positive integer greater than or equal to one and less than or equal to ten, preferably less than or equal to five, X is greater than zero but less than 0.4, a is from about 0.3 to about 1, b is from about 0.1 to about 1.5, c is from about 1 to about 4, d is from about 1 to about 3, e is from about 1 to about 5, Ae is calcium or strontium and Re is selected from the group consisting of lanthanum, neodymium, samarium, europium, gadolinium, terbium, dysprosium, holmium, erbium, thulium, ytterbium and lutetium. When the superconducting oxide contains thallium, K is most preferably two, three or four. When the superconducting oxide contains bismuth, K is most preferably two or three.

The superconducting oxide is desirably a high temperature superconducting oxide selected from the group consisting of $YBa_2Cu_3O_{7-\delta}$ and $Bi_{2-M}Pb_MSr_2 NCa_{K-1-P}Cu_{K-W}O_{2K+4+Y}$, wherein $\delta$, Y, N, M, K, P and W are as defined hereinabove. Other desirable superconducting oxides include mixed valence copper oxides having a formula of the type $La_{2-X}Sr_XCuO_{4-\delta}$, the preparation of which is disclosed by Deslandes U.S. Pat. No. 4,843,059. Still other desirable superconducting oxides include $Tl_2Ba_2Ca_2Cu_3O_{10}$ and other members of the $Tl_JBa_{2-N}Ca_{K-1-P}Cu_{K-W}O_{2K+J+2+Y}$ system. The preparation of $Tl_2Ba_2Ca_2Cu_3O_{10}$ is taught by C.C. Torardi et al., "Crystal Structure of $Tl_2Ba_2Ca_2Cu_3O_{10}$, a 125K Superconductor", *Science*, Vol. 240 (29 Apr. 1988).

R. J. Cava et al., "Bulk Superconductivity at 91K in Single-Phase Oxygen-Deficient Perovskite $YBa_2Cu_3O_7$", *Physical Review Letters* Vol. 58, No. 16, pages 1676–79 (1987), disclose preparation of the title structure and identify its composition E. M. Engler et al., "Superconductivity above Liquid Nitrogen Temperature: Preparation and Properties of a Family of Perovskite-Based Superconductors", *Journal American Chemical Society*, Vol. 109, No. 9, pages 2848–49 (1987), disclose preparation of the compounds $ReBa_2Cu_3O_7$ where Re is one of the rare earth elements listed previously. H. Sasakura et al., "Single High $T_c$ Phase Region of the Bi-Pb-Sr-Ca-Cu-O System", *Japan Journal Applied Physics*, Vol. 28, No. 7, pages L1163-66 (1989), disclose synthesis of superconductors having superconducting transitions at 85 K and 110 K respectively and describe conditions helpful to increasing the yield of the highest temperature superconducting phase. R. J. Cava et al., "Superconductivity Near 70 K in a New Family of Layered Copper Oxides", *Nature*, Vol. 336, pages 211–14 (17 Nov. 1988), disclose the existence of superconductivity in the series of compounds $Pb_2Sr_2Re_{1-Q}Ae_QCu_3O_{8+\delta}$. R. J. Cava et al., "Synthesis of Bulk Superconducting $YBa_2Cu_4O_8$ at One Atmosphere Oxygen Pressure", *Nature*. Vol.338, pages 328–30, (1989), disclose a synthesis of the title compound in pure bulk form.

The compounds described in the preceding paragraph contain, as a common feature, planes of $CuO_5$ square pyramids where copper has an average oxidation number between 2 and 3. Those knowledgeable in the art will recognize that new compounds with these features are still being synthesized and that many of these new compounds are also superconducting. The process of the present invention is designed to work well with high oxidation number copper compounds. As such, it should also work with any superconductor which contains these common features.

The superconductor need not be of any particular morphology. It may be in the form of particles, flakes, spheres, whiskers, wires, plates and the like. Polycrystalline forms such as plates sand wires may be formed using conventional ceramic processing techniques. Wires, filaments, flakes or plates are beneficial because they allow for a continuous pathway for current flow at much lower loadings of superconducting material. Flakes or plates, which have two dimensions larger than the third, are also useful because superconducting properties are anisotropic and are better in two dimensions of the crystal than the third. A suitable size or cross section varies from 10 nanometers to 1 centimeter. A beneficial size or cross section varies from 0.5 micrometers to 100 micrometers. Small superconductor sizes of 100 micrometers or less, help in stabilizing the composite against disturbances of a electrical, thermal or mechanical nature. On the other hand, superconductor sizes of 0.5 micrometer or less increase the possibility of reaction between the superconductor and the metal.

The metal beneficially has the same range of morphologies and sizes as the superconducting material. A metal size similar to the superconductor size can result in a more intimate composite.

Intimate composites are defined as having alternating metals and superconductors with the size ranges defined above. Intimate composites suitably have metal and superconductor sizes between 10 nanometers and 1 centimeter, and beneficially have metal and superconductor sizes between 0.5 micrometers and 100 micrometers. Intimate composites may also be sheathed in an additional layer of metal suitably less than 10 centimeters thick in order to provide better thermal contact to the cooling medium.

From a process point of view, the metal is suitably an element selected from the group consisting of Atomic Numbers 4, 12, 13, 22–30, 40–50, 72–83, alloys of one such element with minor amounts of one or more non-metallic elements such as oxygen, carbon, hydrogen, silicon, boron, nitrogen, phosphorous and sulfur, alloys of two or more of such elements and alloys of at least one of such elements with lithium. The metal as an element is desirably copper, nickel, cobalt, iron, tungsten or chromium The metal as an alloy of the aforementioned elements is desirably bronze, brass, stainless steel, an alloy of nickel and chromium, or an alloy of nickel, chromium and iron and up to 0.5 volume percent of one or more of manganese and copper. Those skilled in the art recognize that metal alloys also include minor amounts of the aforementioned non-metallic elements.

From a composite point of view, the base metal is an element selected from the group consisting of Atomic Numbers 4, 12, 13, 22–28, 30, 40–46, 48, 49, 72–77, 80–83, alloys of two or more of such elements, alloys of one such element with minor amounts of the aforementioned non-metallic elements, alloys of one or more of such elements other than Atomic Number 13 with at least one element selected from the group consisting of lithium, copper, silver, tin, platinum and gold and alloys of aluminum with at least one element selected from the group consisting of lithium, nickel, copper, tin, platinum and gold. The metal as an alloy of the aforementioned elements is desirably bronze, brass, stainless steel, an alloy of nickel and chromium, or an alloy of nickel, chromium and iron and up to 0.5 volume percent of one or more of manganese and copper. Those skilled in the art recognize that metal alloys also include minor amounts of the aforementioned non-metallic elements.

Certain metals, when they are in the form of fine powders with an average particle size of one micrometer and are prepared and stored under inert conditions, can be too reactive with the superconductor One such metal is copper. These metals beneficially have an average particle size of at least 10 micrometers The larger size alleviates at least some of the reactivity.

The admixture suitably contains from about 20 to about 95 percent by volume of superconducting oxide and from about 80 to about 5 percent by volume of metal. Both percentages are based upon total volume of the admixture. The actual admixture composition varies depending upon factors such as the morphology of admixture components and the intended use for the admixture. For example, a continuous current path requires a much lower volume percent of superconducting material if the latter is in the form of filaments rather than spherical particles.

The admixture may be prepared using conventional processes and equipment. The choice of process and equipment is not particularly critical so long as the resultant admixture is generally uniform and substantially free of contaminants. Mixing may be accomplished in a dry, fluid or gaseous state. Suitable mixing procedures include blending, mulling, ball milling, spray drying, vapor deposition and the like. Typical mixing equipment includes ball mills, ribbon blenders and the like. Mixing times may vary depending upon relative proportions of superconducting oxide powder and metal powder in the admixture but are readily determined without undue experimentation. Mixing may also be accomplished at ambient or elevated temperatures and, if necessary, in the presence of one or more binders. The actual procedure, equipment and process parameters vary with the materials being mixed.

The admixture is beneficially converted into a shape before it is heated to a temperature suitable for densification. The admixture can be pressed into containers or fabricated into greenware and then placed into containers. If desired, the greenware may be wrapped in a metal foil before it is placed into a container. Greenware fabrication techniques include dry pressing, slip casting, tape casting, injection molding, extrusion and colloidal pressing. Some greenware techniques require the use of an organic binder or a dispersant. The use of such an additive necessitates an additional step of binder removal prior to placing the greenware in a container. The binder removal step will also remove other volatile organic compounds.

The container may be fabricated of any material which meets three requirements. First, it must not react with the admixture or greenware formed therefrom during consolidation or densification. Second, it must prevent penetration of any pressure transmitting media. Finally, it should be sufficiently malleable or ductile to allow transmission of pressure, preferably isostatic pressure, from the pressure transmitting medium to the greenware or compressed admixture contained therein.

The admixture is suitably heated to a temperature which is high enough to allow the admixture to be densified under pressure to more than about 80 percent of the theoretical density of the admixture, but low enough to substantially preclude melting of the admixture or any of its components and minimize adverse reactions between the superconducting oxide and the metal. The temperature is beneficially low enough to minimize loss of oxygen from the superconducting oxide powder.

Most high temperature superconducting oxides contain copper in high valence states such as $Cu^{II}$ and $Cu^{III}$. On heating these superconducting materials in the presence of most metals a redox reaction occurs in which the copper in the superconductor is reduced (loses oxygen) and the metal is oxidized (gains oxygen). Labile oxygen within the superconductor is the most probable source of oxygen loss. Irrespective of the source, the loss of oxygen causes the superconducting oxide to be present in an oxygen deficient tetragonal phase. This initial loss of oxygen may be reversed by annealing as disclosed herein. In some cases annealing is not, however, necessary. In the case of $YBa_2Cu_3O_7$, processing temperatures of 450° C. or below result in an orthorhombic superconductor which may have a $T_c$ prior to annealing of 50 to 60 K Processing temperatures in the range of 350° C. or below may provide a satisfactory composite which evidences no loss of superconductivity. Processing temperatures which yield suitable results vary with the superconductor. With $Bi_{1.6}Pb_{0.4}Ca_2Sr_{1.5}Cu_3O_{10}$, processing temperatures as high as 500° C. yield no loss of labile oxygen.

If the processing temperatures are too high, e.g., on the order of 1000° C., an irreversible reaction takes place with all metals other than the noble metals such as silver, gold, platinum and palladium. The irreversible reaction occurs because most metals are stronger reducing agents than copper, a component of the superconducting oxides described herein. Because the reaction is not reversible at low temperatures, e.g., less than about 500° C., it is fatal to superconductivity.

The temperature at which the irreversible reaction proceeds sufficiently far to destroy enough of the composite's superconductivity to render it ineffective for intended uses sets a practical upper limit for processing the composites. That temperature will vary with the metals and superconducting oxides chosen for a particular composite. It is, however, readily determined without undue experimentation.

Using $YBa_2Cu_3O_7$ as an example, several guidelines are available for composites prepared in accordance with procedures disclosed herein. Substantial reactivity starts at about 400° C. with zinc and manganese. Niobium, iron and cobalt may be processed at 400° C. but not at 500° C. Copper results in some reaction at 500° C., but substantial amounts of superconductor and metal remain unreacted. Bronze and nickel allow processing at 500° C., but behave like copper does at 500° C. when they are processed at 600° C. Tungsten, chromium and chromium alloys such as iron-chromium, iron-nickel-chromium and nickel-chromium demonstrate no reactivity up to 700° C. according to differential scanning calorimetry. Nickel-chromium composites can, in fact, be heated to 800° C. in either nitrogen or argon without losing their integrity. These examples provide evidence of considerable processing latitude depending upon the materials of choice and their intended application. The foregoing temperatures are merely guidelines and may be altered somewhat by varying the pressure at which the composites are consolidated.

For $YBa_2Cu_3O_7$ composites, stability at temperatures of 700° C. or above is desirable if one is to obtain a sharp electrical transition to zero resistance. Such stability is needed for annealing in the presence of an inert atmosphere for periods of up to 24 hours or even longer.

Applications requiring zero resistance include magnetic shielding and power transmission. Stability at lower temperatures may be sufficient for applications such as magnetic bearings which rely primarily upon the Meissner effect for utility.

Bismuth containing composites, such as those based upon $Bi_{1.6}Pb_{0.4}Ca_2Sr_{1.5}Cu_3O_{10}$, have different processing temperatures than the $YBa_2Cu_3O_7$ composites. By way of illustration, bronze composites may be processed at 425° C., but not at 550° C., while chromium, nickel-chromium and iron-chromium composites may be processed at 600° C. but not at 700° C. Stability at 600° C. is believed to be necessary for zero resistance applications using bismuth containing composites.

Metal-superconducting oxide composites based upon other superconducting oxides will provide varying results in terms of stability. The actual acceptable processing temperatures for a given application should, however, be readily determined without undue experimentation.

A desirable method of converting the admixture into a satisfactory densified article is described in U.S. Pat. No. 4,744,943, the teachings of which are incorporated herein by reference. When such a method is employed, the pressure is suitably applied for a period of time of less than about one hour. The period of time is beneficially less than about thirty minutes, desirably less than about one minute and preferably less than about ten seconds.

U.S. Pat. No. 4,081,272 discloses a glass-encapsulated HIP process. U. S. Pat. No. 3,622,313 discloses a HIP process. The teachings of these patents are incorporated herein by reference. If the glass-encapsulated process is used, a desirable modification includes evacuating the glass capsule containing a part to be densified and eliminating the use of powdered glass. Application of pressure suitably occurs over a period of two hours or less.

The densified admixture of superconducting oxide and metal may, if desired, be heated in an inert gaseous atmosphere at a temperature greater than or equal to that of step a for a period of time between about one hour and about five days. The period of time needed to obtain zero resistance to current flow within the densified admixture varies with the components of the admixture. The time is readily determined without undue experimentation.

The densified admixture of superconducting oxide and metal may, if desired, be annealed at a low temperature of from about 350° C. to about 500° C. in the presence of an oxygen-containing atmosphere. The oxygen-containing atmosphere is beneficially pure oxygen for $YBa_2Cu_3O_{7-\delta}$ composites and an oxygen/inert gas mixture for composites wherein the superconductor contains bismuth. The annealing step may either replace or follow the step of heating in an inert gaseous atmosphere. Annealing increases the oxygen content of the densified admixture. The increased oxygen content can provide an increase in superconductivity. The length of time needed to anneal a particular densified admixture will, of course, depend upon a number of factors such as the initial oxygen content and associated level of superconductivity. The time may, however, be readily determined without undue experimentation.

The following examples are for purposes of illustration only and are not to be construed, by implication or otherwise, as limiting the scope of the present invention. All parts and percentages are by weight unless otherwise specified.

GENERAL ANALYTICAL PROCEDURE

All material samples are analyzed by X-ray diffraction, magnetometry and optical or electron microscopy. In some instances, density of the samples is also determined. X-ray diffraction demonstrates whether or not appreciable reaction occurs between the superconducting material and the metal. Of particular concern is the presence of evidence, in the x-ray diffraction pattern, of decomposition phases of the superconductor, e.g., copper and $BaCO_3$, and of new metal oxide phases formed from oxidation of the metal contained in the composite. The top and bottom surfaces of samples are typically sanded with 600 grit silicon carbide paper prior to examination by X-ray diffraction. The sanding removes traces of reaction between the sample and the container.

Differential Scanning Calorimetry is also used on the admixture to determine the temperature at which reaction first occurs between the metal and the superconductor. Details of the procedure used for Differential Scanning Calorimetry are described in Example 6. In interpreting these results care must be taken to distinguish between an initial mild exotherm which corresponds to reversible loss of oxygen from the superconductor, and a much larger exotherm that occurs during the irreversible destruction of the superconductor. The two exotherms are not always completely separated in the Differential Scanning Calorimetry measurements, in which case x-ray diffraction can be used to confirm whether the superconductor's cationic structure has been destroyed.

Samples for microscopy are mounted in an acrylic resin commercially available from Fulton Metallurgical Products under the trade designation Quickmount ™ prior to polishing. Standard techniques used to flatten and polish the surface of the sample include the use of progressively smaller sizes of diamond paste starting at 30 micrometers and ending with one micrometer on an automatic polishing wheel (Leco Vari-Pol ™ VP-50) using glycerol as a lubricant. The final finish is provided by a vibratory polisher (Buehler Vibromet ™ 2) using first a one micrometer diamond paste and then a 0.25 micrometer diamond paste.

Optical microscopy is used to examine the polished surfaces. The contrast between metal (light colored) and superconducting (dark colored) phases is very pronounced allowing observation of an intimate mixture of superconductor and metal. Magnifications of about 400× are generally sufficient. The degree of intimacy in a particular composite is dependent upon, among other factors, particle size of the metal component and the ratio of metal to superconductor. For a 75 volume percent superconductor/25 volume percent metal composite wherein the metal powder has a starting average particle size of 325 mesh (44 micrometers) or greater, the morphology typically consists of individual grains of metal dispersed in a continuous superconducting matrix For an identical volumetric ratio with metal powders having an average particle size in the one to ten micrometer range, the morphology typically consists of small clusters of metal particles in a continuous superconductor matrix. In neither case is there a total segregation of the metal phase from the superconductor phase. Based upon this observation, the metal and superconductors are intimately mixed on a scale which approximates the size of the metal powder for larger metal powders and a few times the size of the metal powder for the smaller metal powders.

In some cases, Scanning Electron Microscopy (SEM) operated in a backscattered electron mode is used to characterize the sample instead of optical microscopy. The backscattered mode, especially with the sample tilted towards the detector, is needed to obtain contrast between the metal (dark colored) and superconductor (light colored) phases. SEM is particularly suitable for characterization of samples that are not perfectly flat.

When $YBa_2Cu_3O_{7-x}$ is present in an orthorhombic form, no further annealing is required to convert the superconductor into a practical form. If $YBa_2Cu_3O_{7-x}$ is present in a tetragonal form, a low temperature oxygen anneal is necessary. A suitable low temperature oxygen anneal follows the following program in a tube furnace under flowing gas: (a) heat the sample from 150° C. to 420° C. over a period of 2.7 hours: (b) cool the sample to 350° C. over a period of two hours; and (c) allow the sample to cool to ambient temperature. A mix of 20% oxygen and 80% nitrogen is used until the temperature reaches 375° C. at which point 100% oxygen is used until step (c) begins. Once step (c) starts, the mix of oxygen and nitrogen is used again.

Samples containing an orthorhombic phase of $YBa_2Cu_3O_7$ are examined, either before or after annealing, in a magnetometer to determine their magnetic behavior. The magnetometer is a Janis Model 155/150 vibrating sample magnetometer with a superconducting magnet. The samples are examined under one of two conditions, either zero field cooled (ZFC) or field cooled (FC). In the former condition, the magnetic field is turned on after cooling is complete. In the latter condition, samples are cooled in a magnetic field.

In the examples which follow, all magnetic moments are expressed in terms of electromagnetic units per Gauss per gram of superconductor (emu/Gauss/gm). This technique normalizes the data to account for variations from sample to sample of fractional weight of superconductor in a given composite as well as the measuring field under which magnetic measurements are taken. The measuring field varies between 25 Gauss and 40 Gauss. The sample weight typically varies between 70 milligrams and 80 milligrams.

A large negative signal in the range of $10^{-3}$ emu/Gauss/gm of superconductor in a ZFC sample occurs because of extremely high conductivity of superconductive materials. Such a signal is not seen in materials which are not superconducting. Any negative signal in an FC sample is regarded as proof of superconductivity. Both of these occurrences are often referred to colloquially as the Meissner effect. A strict definition of the Meissner effect refers only to the existence of negative signals in FC samples.

EXAMPLE 1

BRONZE/SUPERCONDUCTING OXIDE COMPOSITES PREPARED WITH A POST-FABRICATION ANNEAL

A $YBa_2Cu_3O_{7-x}$, high $T_C$ superconducting powder commercially available from High Tc Superconco under the trade designation Superconco ™ is annealed under flowing oxygen at a temperature of 920° C. for a period of five hours and then slowly cooled to a temperature of 500° C. at a rate of 2° C. per minute. The powder is further cooled at a rate of 0.2° C. per minute to a temperature of 400° C. and then to a temperature of 250° C. at a rate of 2.5° C. per minute before it is allowed to cool to ambient temperature. Bronze powder, commercially available from U.S. Bronze under the trade designation B-409, is mixed with the annealed powder by mulling it in a mortar and pestle with 7.5 milliliters (ml) of toluene. Two different volumetric ratios, 50/50 and 75/25 are prepared in this manner. The 50/50 ratio is prepared from 11.04 grams (g) of annealed powder and 15.31 g of bronze powder. The 75/25 ratio is prepared from 16.56 g of annealed powder and 7.66 g of bronze powder. The powder mixtures are vacuum dried at ambient temperature for sixteen hours.

Each of the dried powder mixtures are placed into separate ¾ inch (1.9 cm) diameter copper cans under flowing nitrogen, and cold pressed at 200 pounds per square inch (1379 kilopascals (KPa)), also under flowing nitrogen. Copper lids are welded, under flowing argon, onto the copper cans to seal the compressed powder mixtures in the presence of a nitrogen atmosphere. The sealed copper can is then placed into a glass pocket fluid die, or isostatic die assembly, preheated at 440° C. for four hours in a nitrogen atmosphere, and then isostatically pressed at 120,000 psi (830 MPa) for six seconds. The pressing procedure is described in more detail in U.S. Pat. Nos. 4,744,943; 4,428,906; and 4,656,002, the teachings of which are incorporated herein by reference. After cooling to ambient temperature, the die assembly is broken and the copper can is recovered. The copper can is then peeled away from the resulting composite material.

Using an oxide diamond saw, the densified composite material is cut into slices having a thickness of two to three millimeters. The slices are cleaned ultrasonically in toluene to remove cutting oil and grit.

X-ray diffraction analysis of the slices shows 15 the presence of the starting materials $YBa_2Cu_3O_{7-x}$ and bronze as well as a trace of copper oxide. This indicates that little, if any, reaction occurs between the superconductor and the metal. The $YBa_2Cu_3O_{7-x}$ is present in the tetragonal form. A low temperature oxygen anneal, as described hereinabove, converts the $YBa_2Cu_3O_{7-x}$ to a more useful orthorhombic form.

The top and bottom surfaces of the annealed slices are dark, an indication of surface oxidation. Hand polishing using SiC. paper with successively finer grits of 120, 180, 320, 400 and 600 removes the surface oxidation. Subsequent x-ray diffraction analysis confirms that all metal is present in metallic, rather than oxide, form and that the $YBa_2Cu_3O_{7-x}$ is fully oxidized.

Figure 1:
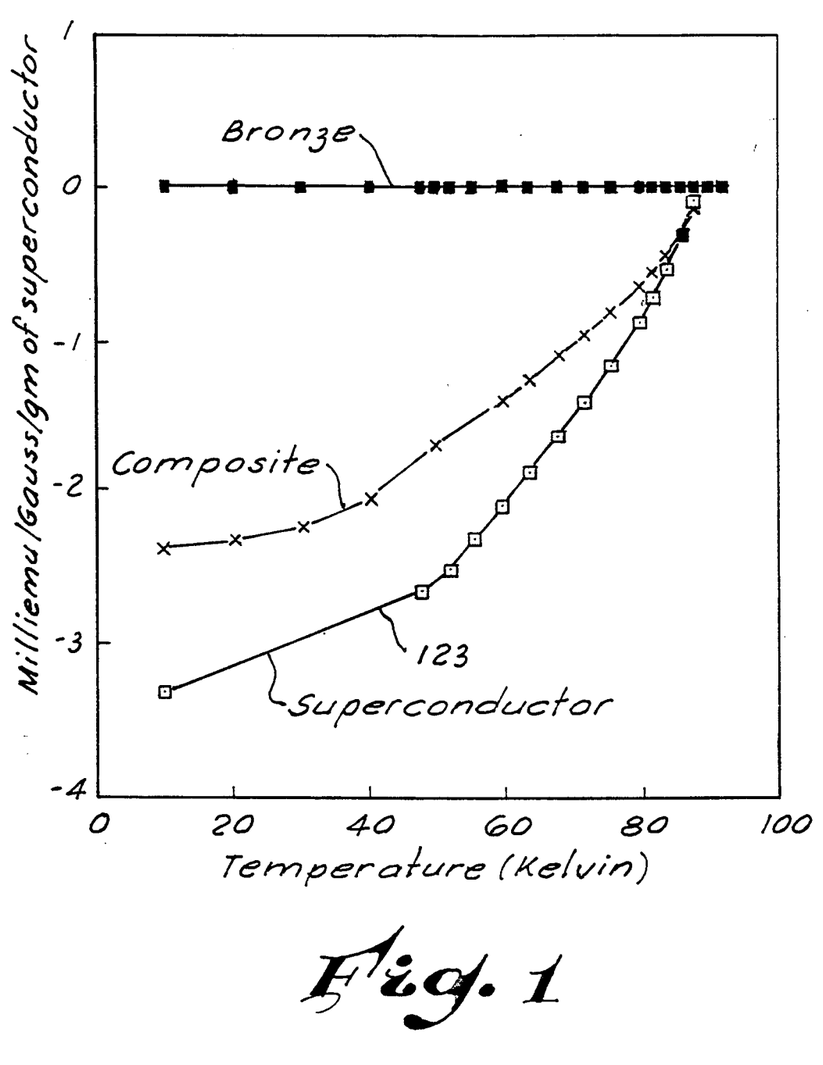
FIG. 1 is a plot of the Field Cooled magnetic moment versus temperature for the composite of Example 1 in comparison to those for bronze and $YBa_2Cu_3O_7$ alone.

The polished samples are examined for their magnetic behavior using a Vibrating Sample Magnetometer manufactured by Janis Research. The ZFC magnetic moments at 4.2 K are $-4.48 \times 10^{-3}$ emu/Gauss/gm of superconductor for the 75 volume percent superconductor composite and $-5.06 \times 10^{-3}$ emu/Gauss/gm of superconductor for the 50 volume percent superconductor composite. Pure superconductor powder, by way of contrast, has a magnetic moment at 4.2 K of $-6.2 \times 10^{-3}$ emu/Gauss/gm of superconductor. The negative values indicate that the composites are superconductive. The FC magnetic moments for the 75 volume percent composite, bronze and the superconducting powder, measured with a 32 gauss field, are shown in FIG. 1. The negative moment values are indicative of superconductivity. The temperature at which the magnetic moment becomes negative for the composite, 90 K., is equal to $T_c$ of the superconducting powder.

EXAMPLE 2

BRONZE/SUPERCONDUCTING OXIDE COMPOSITE PREPARED WITHOUT A POST-FABRICATION ANNEAL

A superconductor/metal composite having a 75/25 volume ratio is prepared from 66.23 grams of $YBa_2Cu_3O_7$ powder annealed as in Example 1 and 30.72 grams of the same bronze powder as used in Example 1. The powders are mixed by ball milling for 20 minutes in a 500 ml high density polyethylene bottle using 459 gms of ⅜ inch (0.95 cm) zirconia milling media. The powder mix is separated from the media using a 100 mesh (150 micrometer) standard sieve on a mechanical vibrator for two minutes at a low speed setting.

The powder mix is separated into two portions, one (Example 2A) 31.8 gms and the other (Example 2B) 26.1 gms. Each portion is placed in a separate copper can, cold pressed and sealed as in Example 1. Each can is placed in a separate glass pocket fluid die. Both die/can assemblies are preheated to 300° C. and held at that temperature for one hour. Example 2A is then heated to a temperature of 375° C. over a period of 90 minutes and then isostatically pressed as in Example 1. Example 2B is heated to a temperature of 500° C. over a period of 80 minutes and then isostatically pressed as in Example 1. The consolidated materials are then recovered as in Example 1.

X-ray diffraction analysis of Example 2B provides essentially the same results as in Example 1. As such, the material is not examined further. X-ray diffraction analysis of Example 2A shows the same phases as Example 2B with one modification. The $YBa_2Cu_3O_7$ phase in Example 2A is in the preferred orthorhombic form rather than the tetragonal form of Example 2B.

Figure 2:
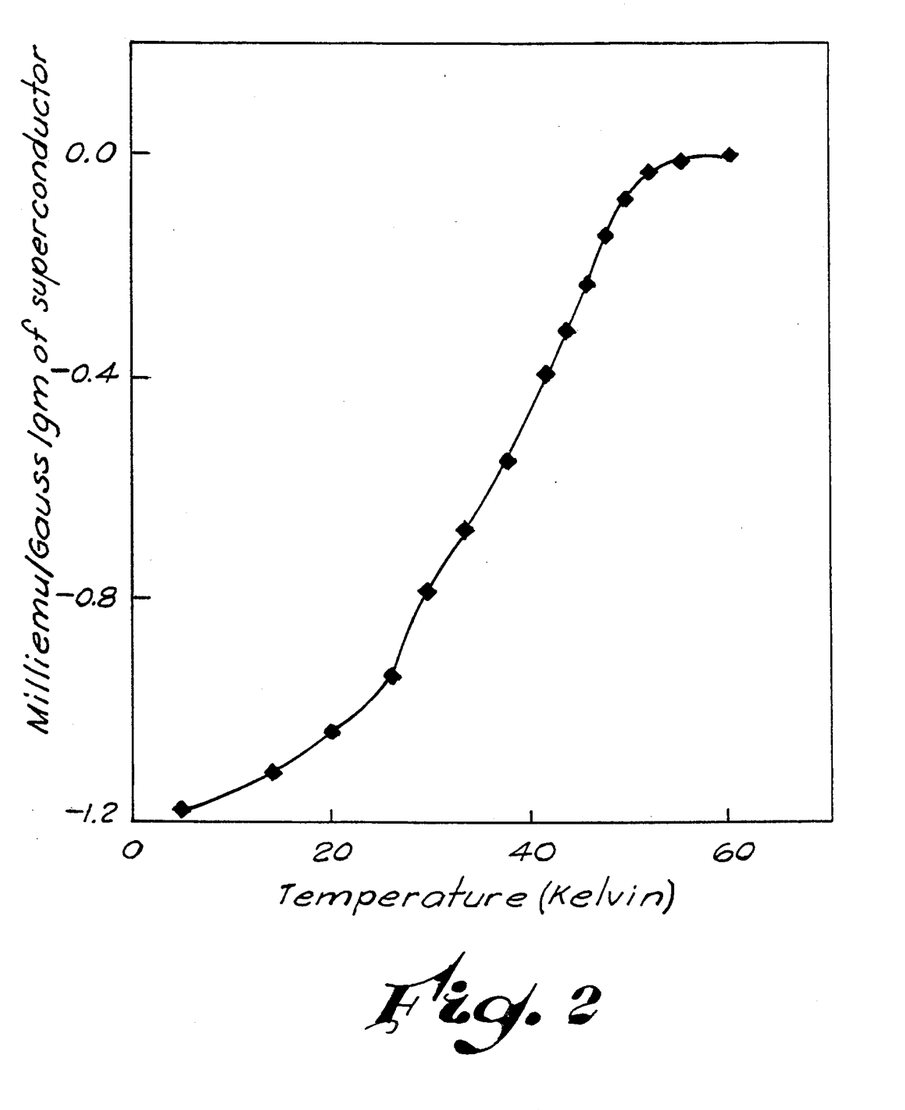
FIG. 2 is a plot of the Field Cooled magnetic moment versus temperature for the composite of Example 2.

Example 2A is evaluated for its ZFC and FC magnetic moments using the procedures outlined in Example 1. The ZFC moment at 4.2 K is $-2.35$ emu/Gauss/gm of superconductor, smaller than that of Example 1, but still clearly superconducting. The FC moment as a function of temperature is shown in FIG. 2. The superconducting transition temperature is about 58 K.

Example 2A is annealed and polished using the procedure of Example 1. The ZFC moment at 4.2 K is $-4.70$ emu/Gauss/gm of superconductor as opposed to $-4.48$ emu/Gauss/gm of superconductor for Example 1. The $T_c$ or transition temperature is about 90 K., the same as in Example 1. Annealing, while it clearly improves superconducting properties, is not necessary if the superconducting properties of the non-annealed material are suitable for a given application.

EXAMPLE 3

BRONZE/SUPERCONDUCTING OXIDE COMPOSITES USING A DIFFERENT MORPHOLOGY OF $YBa_2Cu_3O_7$

A $YBa_2Cu_3O_7$, high $T_c$ superconducting powder commercially available from W. R. Grace & Co. under the trade designation Super $T_c$ 1-2-3 is annealed in a tube furnace under a flowing gaseous mixture of 75 volume percent nitrogen and 25 volume percent oxygen at a temperature of 980° C. for a period of 24 hours. The powder is then cooled at a rate of 1.6° C./minute to 500° C. and held at that temperature for one hour. The powder is then cooled at a rate of 1.7° C./minute to 400° C. and thereafter at a rate of 10° C./hour to 350° C. before it is allowed to cool to ambient temperature. This heat treatment increases the average grain size of the powder.

The annealed powder and bronze powder are mixed as in Example 2. Two thirty gram portions of the mixed powder are placed in separate copper cans, cold pressed and sealed. One can (Example 3A) is sealed as in Example 1. The other can (Example 3B) is sealed under vacuum by an alternate procedure. In this alternate procedure, the lid has a stem which is connected to a vacuum pump after the lid is welded onto the can. After about one hour, the stem is crimped tightly, the vacuum pump is disconnected and the stem is welded shut.

The sealed cans are placed in separate glass pocket fluid dies, heated as in Example 2 to a temperature of 440° C. and then isostatically pressed as in Example 2. The recovered densified material has a density of 92 percent of theoretical. Optical microscopy of polished surfaces of the material shows the presence of an intimate mixture of superconducting material and metal.

Pieces weighing about 75 milligrams are taken from Examples 3A and 3B and measured for magnetic moment before and after annealing as in Example 2. The ZFC moment at 4.2 K for Example 3A is $-3.93 \times 10^{-3}$ emu/Gauss/gm of superconductor before annealing and $-7.47 \times 10^{-3}$ emu/Gauss/gm of superconductor after annealing. The ZFC moment at 4.2 K for Example 3B is $-3.62 \times 10^{-3}$ emu/Gauss/gm of superconductor before annealing and $-7.16 \times 10^{-3}$ emu/Gauss/gm of superconductor after annealing. This demonstrates that either welding technique may be used.

Figure 3:
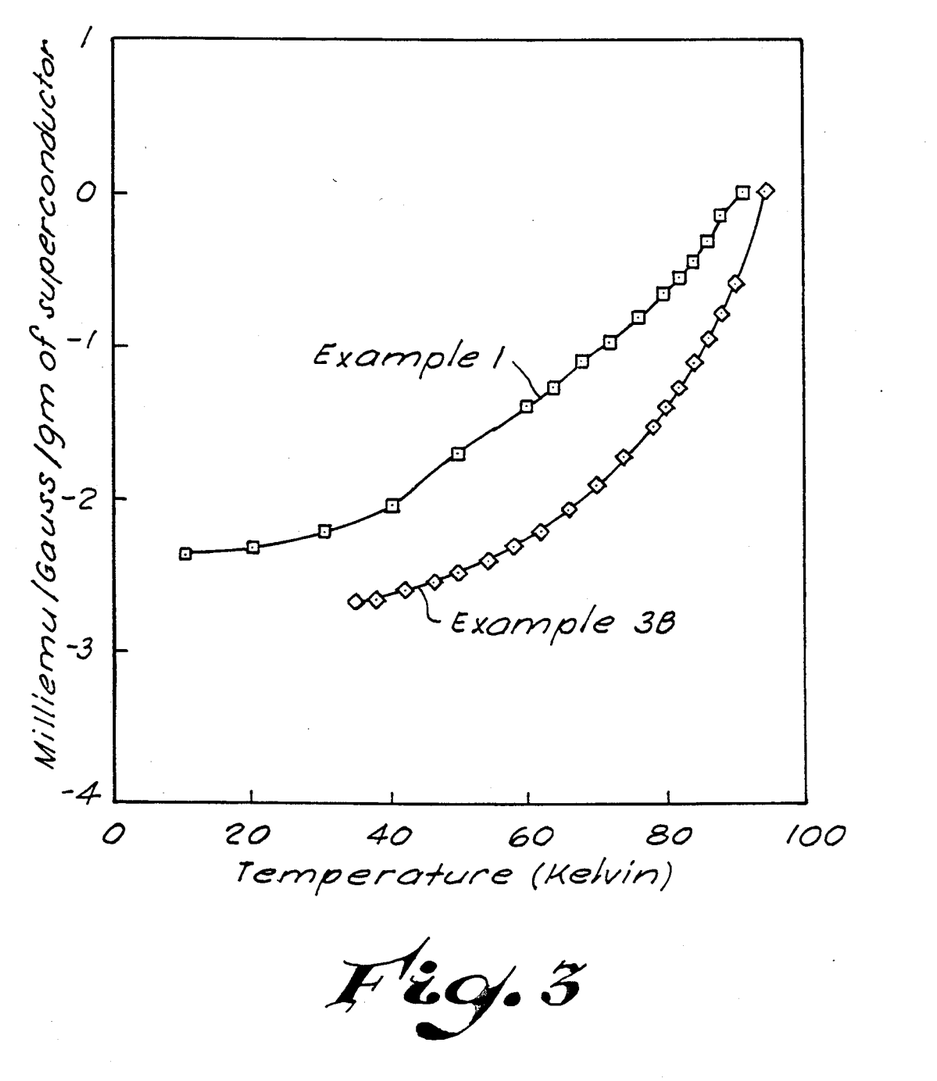
FIG. 3 is a plot of the Field Cooled magnetic moment versus temperature for the composites of Examples 1 and 3B.

The FC moment at 4.2 K for Example 3A before annealing is $-1.90 \times 10^{-3}$ emu/Gauss/gm of superconductor. The post-annealed FC moments for Examples 1 and 3B are shown in FIG. 3.

The post-annealed sample of Example 3A also levitates a disc-shaped Nd-Fe-B magnet measuring 5/16 inch (0.8 cm) in diameter by ⅛ inch (0.3 cm) in thickness and weighing 1.1 grams to a height of 0.6 centimeters. The ability to levitate the magnet shows that the magnetic force between the magnet and the superconducting material is greater than the gravitational force on the magnet. This implies that the composites can be used in applications requiring levitation such as magnetic bearings, motors and gyroscopes.

EXAMPLE 4

BRONZE/SUPERCONDUCTING OXIDE COMPOSITE FORMED INTO THE SHAPE OF A TUBE BY ISOPRESSING

A mixture of $YBa_2Cu_3O_7$ and bronze identical to that of Example 3 is isopressed cold at 50,000 psi (345 MPa) into the shape of a tube having a length of 1.5 inch (3.8 cm), an outer diameter of 1.1 inch (2.8 cm) and an inner diameter of 0.375 inch (1 cm) using an appropriately shaped mold. The mold is constructed of 60 durometer hardness polyurethane on the outside with an inner mandrel of hardened stainless steel.

The cold-isopressed tube is removed from the mold and mandrel. The inner mandrel is replaced by a 0.375 inch (1 cm) copper mandrel. The outer surface of the tube is wrapped with three layers of copper foil. The wrapped tube is placed in a glass pocket fluid die, heated to 450° C. as in Example 2 and then isostatically pressed, also as in Example 2.

After cooling, the copper mandrel is drilled out of the tube. Drilling is done dry because water attacks the $YBa_2Cu_3O_7$. The tube has an outer surface layer with a dark bronze color. After removal of this outer layer, x-ray diffraction of the tube shows the presence of two components, unreacted $YBa_2Cu_3O_7$ and bronze.

This example illustrates that composites of the present invention can be fabricated into shapes. Similar results are expected with other composites prepared as described herein. The tube shape of this example has potential utility in magnetic shielding applications.

EXAMPLE 5

BRONZE/SUPERCONDUCTING OXIDE COMPOSITE USING $Bi_{1.6}Pb_{0.4}Ca_2Sr_{1.5}Cu_3O_{10}$ AS THE OXIDE

Preparation of $Bi_{1.6}Pb_{0.4}Ca_2Sr_{1.5}Cu_3O_{10}$

Four reactants are added to a two liter polyethylene jar containing 400 ml of zirconia milling media and 260 ml of water and wet ball milled for three hours to form a reactive mixture. The reactants are: (a) 186.38 grams of 99.9999% $Bi_2O_3$ (Johnson Matthey): (b) 44.64 gms of 99.99% PbO (Alfa Products); (c) 100.8 gms of reagent grade low alkali $CaCO_3$ (J. T. Baker): and (d) 119.3 gms of ACS grade cupric oxide (Fisher Scientific). The mixture is dried in a vacuum oven until dry and then separated from the milling media using a 100 mesh (150 micrometer) standard sieve on a mechanical vibrator. The mixture is heated from 200° C. to 820° C. at a rate of 300° C. per hour, held at that temperature for six hours and then cooled to room temperature at a rate of 300° C. per hour to provide an intermediate product.

The cooled intermediate product is broken up in a mortar and pestle until it passes through an 18 mesh (925 micrometer) sieve. The sieved intermediate product is ball milled for 24 hours using 400 ml of zirconia milling media in a liquid composed of 300 ml of toluene and 3 drops of oleic acid. The milled intermediate product is dried in a vacuum oven using a dry ice acetone trap to prevent movement of the solvent into the pump. The intermediate product is then separated from the milling media using the 100 mesh (150 micrometer) standard sieve on a mechanical vibrator. The intermediate product is then sieved through a 200 mesh (75 micrometer) standard sieve on the mechanical vibrator.

The intermediate product is heated from 200° C. to 830° C. at a rate of 300° C. per hour, held at that temperature for twelve hours and then cooled to room temperature at a rate of 300° C. per hour to provide a heat treated intermediate product. This product is then ball milled for three hours using 400 ml of zirconia milling media in a liquid composed of 300 ml of toluene and 3 drops of oleic acid, dried, separated from the milling media and sieved through the 200 mesh (75 micrometer) standard sieve.

The heat treated intermediate product is heated from 200° C. to 830° C. at a rate of 7° C. per minute, then from 830° C. to 860° C. at a rate of 1° C. per minute, held at that temperature for forty-eight hours and then cooled to room temperature at a rate of 300° C. per hour to provide $Bi_{1.6}Pb_{0.4}Ca_2Sr_{1.5}Cu_3O_{10}$ as a final product. The final product is ball milled dry for 30 minutes using 400 ml of zirconia milling media and then sieved through a 270 mesh (53 micrometer) standard sieve.

Preparation of the Composite

The $Bi_{1.6}Pb_{0.4}Ca_2Sr_{1.5}Cu_3O_{10}$ powder is mixed with the same bronze powder as in Example 1 to provide composite volume ratios of 75/25 and 50/50 using the procedure of Example 2. The 75/25 mixture (Example 5A) is prepared from 20.53 gms of bronze powder and 43.45 gms of the $Bi_{1.6}Pb_{0.4}Ca_2Sr_{1.5}Cu_3O_{10}$ powder and the 50/50 mixture (Example 5B) is prepared from 40.81 gms of bronze powder and 29.02 gms of the $Bi_{1.6}Pb_{0.4}Ca_2Sr_{1.5}Cu_3O_{10}$ powder. The powder mixtures are processed as in Example 2 save for heating to a temperature of 425° C. prior to isostatic pressing rather than 375° C. or 500° C.

X-ray diffraction analysis of Examples 5A and 5B shows peak positions which match those of bronze or $Bi_{1.6}Pb_{0.4}Ca_2Sr_{1.5}Cu_3O_{10}$. As in Example 1, this indicates the absence of any reaction between the metal and the superconducting material. By way of contrast, a like sample heated to 550° C. prior to pressing shows no discernible $Bi_{1.6}Pb_{0.4}Ca_2Sr_{1.5}Cu_3O_{10}$ when subjected to X-ray diffraction analysis.

Example 5A has a ZFC moment at 4.2 K of $-2.81 \times 10^{-3}$ emu/Gauss/gm of superconductor and an FC moment, also at 4.2 K., of $-1.68 \times 10^{-3}$ emu/Gauss/gm of superconductor. Example 5B has a ZFC moment at 4.2 K of $-0.75 \times 10^{-3}$ emu/Gauss/gm of superconductor and an FC moment, also at 4.2 K., of $-0.39 \times 10^{-3}$ emu/Gauss/gm of superconductor. The superconducting transition temperature is about 90 K. for Example 5A and about 100 K. for Example 5B.

EXAMPLE 6

COPPER/SUPERCONDUCTING OXIDE COMPOSITE

The procedure of Example 2 is duplicated, with one exception, for a composition like that of Example 2 save for substitution of 31.31 grams of copper powder for the bronze powder. The copper powder has an average particle size of less than about 45 micrometers and is commercially available from Cerac under the trade designation C-1241.The exception involves placing 30 gms of powder mixture in each of the cans prior to cold pressing rather than the amounts specified in Example 2. Examples 6A and 6B have a relative density, after annealing, of 86% of theoretical.

X-ray diffraction analysis of Example 6A shows a mixture of tetragonal $YBa_2Cu_3O_7$ and copper. X-ray diffraction analysis of Example 6B shows the presence of cuprous oxide ($Cu_2O$) in addition to $YBa_2Cu_3O_7$ and copper. As such, oxidation of copper metal occurs even though the metal and the superconducting oxide only react partially if the powder mixture is heated to a temperature such as 500° C. prior to pressing.

By way of contrast, a composite containing a different copper powder, commercially available from Cerac under the trade designation C-1229, with an average particle size of two micrometers shows evidence of considerable reaction between the superconductor and metal phases when the composite is heated to 440° C. before isopressing as in Example 1. Prior to use, this copper powder is prepared and stored in an inert atmosphere of gaseous argon. This shows that particle size of the metal powder may have an effect upon properties of the resultant composite.

Reactivity between copper and the superconducting oxide is independently estimated via differential scanning calorimetry. Approximately 90 gms of the powder mixture are placed into the calorimeter and exposed to a 40 cc/minute flow of argon gas. The powder mixture is heated at a rate of 20° C. per minute from a temperature of 50° C. to a temperature of 700° C. An exothermic peak, indicating substantial reaction between the metal and the superconductor, is centered at 590° C. with an onset temperature of 554° C. At temperatures lower than 554° C., there is a deviation from the baseline extending below 500° C. This deviation corresponds to a limited reaction between the superconductor and the metal. It also corroborates the results of the X-ray diffraction analysis.

Example 6A has a ZFC magnetic moment at 4.2 K. of $-4.48 \times 10^{-3}$ emu/Gauss/gm of superconductor and an FC magnetic moment at 6 K of $-1.89 \times 10^{-3}$ emu/Gauss/gm of superconductor. The superconducting transition temperature is about 90K. Example 6B has a ZFC magnetic moment at 4.2 K of $-2.36 \times 10^{-3}$ emu/Gauss/gm of superconductor. The lower ZFC value for Example 6B may be an indication of some reaction between the metal and superconductor.

EXAMPLE 7

NICKEL/SUPERCONDUCTING OXIDE COMPOSITE

A superconductor/metal composite having a 75/25 volume ratio is prepared from 49.68 gms of $YBa_2Cu_3O_7$, annealed as in Example 1, and 23.4 gms of nickel powder (Johnson Matthey under the trade designation 10256A). The nickel powder has an average particle size of three to seven micrometers. The powders are mixed by ball milling for 35 minutes in a 1-liter polyethylene bottle using 290 gms of ⅜ inch (0.95 cm) zirconia milling media. The powder mix is separated from the milling media as in Example 2.

Two copper cans are made from two inch (5.08 cm) lengths of ⅜ inch (0.95 cm) copper tubing by crimping and welding one end of the tubing. An amount of the powder mix sufficient to provide a packed powder bed of one inch (2.54 cm) in depth is pressed into each of the cans. The tops of the cans are then crimped, but not welded. Each can is placed into a separate glass pocket fluid die.

One copper can (Example 7A) is heated to a temperature of 400° C. before isostatic pressing as in Example 2. The other can (Example 7B) is heated to a temperature of 500° C. before isostatic pressing.

Example 7A has a density of 85% of theoretical and Example 7B has a density of 87% of theoretical. Optical microscopy of polished surfaces of Example 7A shows the presence of an intimate mixture of superconducting material and metal.

X-ray diffraction analysis of Examples 7A and 7B shows the presence of nickel and $YBa_2Cu_3O_7$, the latter being in its tetragonal form. The absence of nickel oxide shows that nickel is less reactive than copper at 500° C. A low temperature oxygen anneal, as in Example 1, converts the $YBa_2Cu_3O_7$ to its orthorhombic form.

Because nickel itself is ferromagnetic, it has a magnetic moment opposite in sign to that of a superconductor. As such, the moment measured at 4.2 K. is a composite of two moments and does not provide a definitive measure of whether or not the $YBa_2Cu_3O_7$ is superconducting. Increasing the temperature to 100 K. has no effect upon the magnetic moment of nickel. At this temperature, the $YBa_2Cu_3O_7$ is no longer superconducting. As such, a measure of the difference in magnetic moment at 100 K and 4.2 K provides an indication of the contribution of the superconductor to the magnetic moment at 4.2 K. Using this criterion, the ZFC moment of Example 7A is $-2.50 \times 10^{-3}$ emu/Gauss/gm of superconductor and that of Example 7B is $-2.21 \times 10^{-3}$ emu/Gauss/gm of superconductor.

EXAMPLE 8

COBALT/SUPERCONDUCTING OXIDE COMPOSITE

The procedure of Example 7 is duplicated save for substituting 23.4 gms cobalt powder (Johnson Matthey under the trade designation 10455) having an average particle size of 1.6 micrometers for the nickel powder of Example 7.

Example 8A, heated to a temperature of 400° C., has a density of 82% of theoretical. Optical microscopy of polished surfaces shows an intimate mixture of metal and superconducting material. X-ray diffraction analysis shows the presence only of cobalt and $YBa_2Cu_3O_7$, the latter being in its tetragonal form. A low temperature oxygen anneal, as in Example 1, converts the $YBa_2Cu_3O_7$ to its orthorhombic form. The ZFC magnetic moment, calculated according to the modified procedure of Example 7, is $-1.6 \times 10^{-3}$ emu/Gauss/gm of superconductor.

Example 8B, heated to a temperature of 500° C., is shown by x-ray diffraction analysis, to include cobalt oxide and copper, in addition to cobalt and $YBa_2Cu_3O_7$. This indication of at least partial reaction between cobalt and $YBa_2Cu_3O_7$ is borne out by a much smaller ZFC magnetic moment of $-0.34 \times 10^{-3}$ emu/Gauss/gm of superconductor.

EXAMPLE 9

IRON/SUPERCONDUCTING OXIDE COMPOSITES

The procedure of Example 7 is duplicated with two exceptions. First, 20.6 gms iron powder (Johnson Matthey under the trade designation 10214) having a particle size range of one to nine micrometers are substituted for the nickel powder of Example 7. Second, only Example 9A (heated to 400° C.) is isopressed.

Differential scanning calorimetry, as in Example 6, shows that reaction between the metal and the superconducting material occurs at a temperature greater than 400° C. but less than 500° C. As such, Example 9B is heated to 500° C. and held at that temperature for five hours to estimate reactivity. X-ray diffraction shows that about 10 percent by weight of the starting materials react, as indicated by the presence of $BaCO_3$, copper and iron oxide. The remaining 90 percent by weight is iron and $YBa_2Cu_3O_7$.

Optical microscopy of polished surfaces of isopressed Example 9A shows the presence of an intimate mixture of iron and $YBa_2Cu_3O_7$. The iron and $YBa_2Cu_3O_7$ are substantially non-reactive as evidenced by x-ray diffraction indicating no more than a trace of $Fe_3O_4$. After annealing, Example 9A has a ZFC. magnetic moment, determined in accordance with the modified procedure of Example 7, of $-2.14 \times 10^{-3}$ emu/Gauss/gm of superconductor.

EXAMPLE 10

CHROMIUM/SUPERCONDUCTING OXIDE COMPOSITES

The procedure of Example 7 is duplicated save for substituting chromium powder (Johnson Matthey under the trade designation 10153) having a particle size range of one to five micrometers for the nickel powder of Example 7. The 75/25 volume ratio requires 6.29 gms of chromium powder and 16.56 gms of $YBa_2Cu_3O_7$ powder.

Differential scanning calorimetry demonstrates that there is substantially no reaction between chromium and $YBa_2Cu_3O_7$ below 850° C. Accordingly, Example 10A is heated to 400° C. and Example 10B is heated to 700° C. before isopressing.

X-ray diffraction analysis of Example 10A indicates some surface reaction where the mixed powders contact the copper can. The surface can be cleaned by sanding with 600 grit SiC paper to remove the surface reaction products or impurities. After annealing, Example 10A has a ZFC magnetic moment, determined as in Example 1, of $-1.50 \times 10^{-3}$ emu/Gauss/gm of superconductor.

X-ray diffraction analysis of Example 10B indicates an even greater degree of surface reaction where the mixed powders contact the copper can. As with Example 10A, the surface can be cleaned with SiC paper. After annealing, Example 10B has a ZFC magnetic moment, determined as in Example 1, of $-0.55 \times 10^{-3}$ emu/Gauss/gm of superconductor. The ZFC magnetic moment, while smaller than that of Example 10A, still provides evidence of superconductivity.

EXAMPLE 11

TUNGSTEN/SUPERCONDUCTING OXIDE COMPOSITES

The procedure of Example 7 is duplicated save for substituting 50.66 gms of tungsten powder (Alfa Products under the trade designation 00620) having a particle size range of two to 26 micrometers for the nickel powder of Example 7.

Example 11A, heated to 400° C. before isopressing and annealed thereafter, has a ZFC magnetic moment at 4.2 K of $-1.86 \times 10^{-3}$ emu/Gauss/gm of superconductor, an FC magnetic moment at 4.2 K of $-1.23 \times 10^{-3}$ emu/Gauss/gm of superconductor and a $T_c$ of about 90 K. Example 11B, heated to 500° C. before isopressing and annealed thereafter, has a ZFC magnetic moment at 4.2 K of $-1.56 \times 10^{-3}$ emu/Gauss/gm of superconductor.

EXAMPLE 12

NICKEL-CHROMIUM ALLOY/SUPERCONDUCTING OXIDE COMPOSITES

The procedure of Example 7 is duplicated save for substituting an 80 weight percent nickel/20 weight percent chromium alloy powder (Johnson Matthey under the trade designation 13108) having a particle size range of 45 to 106 micrometers for the nickel powder of Example 7. The 75/25 volume ratio requires 7.52 gms of alloy powder and 16.56 gms of $YBa_2Cu_3O_7$ powder.

Differential scanning calorimetry demonstrates that there is substantially no reaction between the alloy powder and $YBa_2Cu_3O_7$ below 910° C. Accordingly, Example 12A is heated to 400° C. and Example 12B is heated to 700° C. before isopressing.

Example 12A, after annealing, has a ZFC magnetic moment at 4.2 K of $-1.58 \times 10^{-3}$ emu/Gauss/gm of superconductor. X-ray diffraction analysis of Example 12B shows the presence of some surface impurity where the powder mixture contacts metallic copper. The impurity can be removed with SiC paper as in Example 10. Example 12B, after annealing, has a ZFC magnetic moment at 4.2 K of $-1.73 \times 10^{-3}$ emu/Gauss/gm of superconductor, an FC magnetic moment at 34 K of $-0.83 \times 10^{-3}$ emu/Gauss/gm of superconductor and a $T_c$ of about 82 K.

EXAMPLE 13

IRON-NICKEL-CHROMIUM ALLOY/SUPERCONDUCTING OXIDE COMPOSITES

The procedure of Example 7 is duplicated save for substituting 23.4 gms of an alloy for the nickel powder used in Example 7. The alloy contains 76 percent nickel, 15.5 percent chromium, 8 percent iron and 0.5 percent other elements and is commercially available from Materials Research Corporation under the trade designation Inconel TM 600.

Example 13A (heated to 400° C.) and Example 13B (heated to 500° C.) have densities, respectively, of 85% and 88% of theoretical. Optical microscopy of a polished surface of Example 13B shows the presence of an intimate mixture of the alloy and $YBa_2Cu_3O_7$. The alloy and $YBa_2Cu_3O_7$ are substantially non-reactive at both 400° C. and 500° C., as evidenced by x-ray diffraction which fails to disclose the presence of any phases other than the starting materials.

Like nickel, the alloy is ferromagnetic and has a magnetic moment opposite in sign to that of a superconducting material. The magnetic moment of the alloy, however, is unlike that of nickel, cobalt or iron in that it varies between 4 K and 100 K. As such, the procedure of Example 1 is modified by determining the difference in magnetic moment at 4 K between the composite and an amount of alloy equivalent to that contained in the composite. From this difference, the magnetic moment due to the superconducting material is estimated. Using this modified procedure, Examples 13A and 13B have ZFC magnetic moments, respectively, of $-1.80 \times 10^{-3}$ emu/Gauss/gm of superconductor and $-1.17 \times 10^{-3}$ emu/Gauss/gm of superconductor.

EXAMPLE 14

IRON-CHROMIUM ALLOY/SUPERCONDUCTING OXIDE COMPOSITES USING $Bi_{1.6}Pb_{0.4}Ca_2Sr_{1.5}Cu_3O_{10}$ AS THE OXIDE

The procedure of Example 7 is duplicated save for changing both the metal and the superconducting material and heating only one sample to temperature (500° C.) prior to isopressing. The metal is an alloy of 87.5% iron and 12.5% chromium commercially available from Alfa Products as stainless steel 410-L. The metal is composed of irregularly shaped particles having a size range between 10 and 45 micrometers. $Bi_{1.6}Pb_{0.4}Ca_2Sr_{1.5}Cu_3O_{10}$, prepared as in Example 5, is substituted for $YBa_2Cu_3O_7$. A 75/25 volume mixture requires 16.33 gms of the superconducting material and 6.83 gms of the stainless steel.

Optical microscopy of a polished surface of the isopressed material shows the presence of an intimate mixture of the alloy and the superconducting oxide. The alloy and the superconducting oxide are substantially non-reactive at 500° C., as evidenced by x-ray diffraction which fails to disclose the presence of any phases other than the starting materials. After annealing, the material of Example 14 has a ZFC magnetic moment, determined as in Example 7, of $-1.72 \times 10^{-3}$ emu/Gauss/gm of superconductor.

EXAMPLE 15

METAL/SUPERCONDUCTING OXIDE COMPOSITES USING $Bi_{1.6}Pb_{0.4}Ca_2Sr_{1.5}Cu_3O_{10}$ AS THE OXIDE

The procedure of Example 14 is replicated save for substituting three different metals for that used in Example 14. Example 15A contains 7.8 gms of the nickel powder used in Example 7. Example 15B contains 6.29 gms of the chromium powder used in Example 10. Example 15C contains 7.53 gms of the 80 weight percent nickel/20 weight percent chromium alloy used in Example 12.

Optical microscopy of polished surfaces of Examples 15 A–C shows the presence of intimate mixtures of metal and superconducting oxide. X-ray diffraction analysis discloses no phases other than the starting materials.

After annealing, Example 15A has a ZFC magnetic moment, determined as in Example 7. of $-2.85 \times 10^{-3}$ emu/Gauss/gm of superconductor. After annealing, Example 15B and 15C have magnetic moments, determined as in Example 1, of $-2.49 \times 10^{-3}$ emu/Gauss/gm of superconductor and $-3.16 \times 10^{-3}$ emu/Gauss/gm of superconductor respectively.

EXAMPLE 16

BRONZE/SUPERCONDUCTING OXIDE COMPOSITE PREPARED WITH A LOW PRESSURE ISOPRESSING PROCEDURE

The procedure of Example 2 is, save for using a 30 gm quantity of mixed powders, duplicated for Example 16A. The procedure of Example 2 is modified for Example 16B by performing hot isopressing in a Model QIH9 Hot Isostatic Press (HIP) unit commercially available from ABB Autoclave Inc. As with Example 16A, Example 16B employs a 30 gm quantity of mixed powders. Example 16A is heated to 440° C. before isopressing as in Example 2. The sealed can containing the powder of Example 16B is placed inside the HIP unit, heated to 440° C. and subjected to isostatic pressure of 25,000 psi (172 MPa) for a period of one hour.

Examples 16A and 16B have densities, respectively, of 88% and 83% of theoretical. X-ray diffraction analysis of Examples 16A and 16B shows the presence of only the tetragonal form of $YBa_2Cu_3O_7$ and bronze. After annealing, the ZFC magnetic moments for Examples 16A and 16B are, respectively, $-1.89 \times 10^{-3}$ emu/Gauss/gm of superconductor and $-1.97 \times 10^{-3}$ emu/Gauss/gm of superconductor.

This example shows that, other than density, the resulting materials are essentially the same. As such, a lower pressure may be used to prepare composites if the lower density obtained thereby is acceptable. Similar results are expected with other composites disclosed herein.

What is claimed is:

1. A method for preparing a superconducting ceramic-metal composite article comprising:
   a. heating an admixture of a superconducting oxide and a metal to a temperature which is high enough to allow the admixture to be densified under pressure to more than about 80 percent of the admixture's theoretical density but low enough to substantially preclude melting of the admixture or any of its components and minimize adverse reactions between the superconducting oxide and the metal; and
   b. subjecting said heated admixture to a pressure in excess of 15,000 pounds per square inch (103 megapascals) for a period of time sufficient to form a densified article having a density of greater than about 80% of the admixture's theoretical density.

2. The method of claim 1 wherein the pressure is isostatic pressure.

3. The method of claim 2 wherein the temperature to which the admixture is heated is sufficiently low to minimize loss of oxygen from the superconducting oxide.

4. The method of claim 2 wherein the admixture is converted to a shaped greenware article prior to heating.

5. The method of claim 4 wherein, prior to heating, the shaped greenware article is placed in a container formed from a material which is substantially fully dense and incompressible at room temperature but capable of plastic flow at elevated temperatures and pressures.

6. The method of claim 2 wherein, prior to heating, the admixture is placed in a container formed from a material which is substantially fully dense and incompressible at room temperature but capable of plastic flow at elevated temperatures and pressures.

7. The method of claim 2 wherein the temperature is from about 200° to about 1000° Celsius.

8. The method of claim 2 wherein the temperature is from about 350° to about 700° Celsius.

9. The method of claim 2 wherein the isostatic pressure is from about 80,000 pounds per square inch (550 megapascals) to about 200,000 pounds per square inch (1375 megapascals).

10. The method of claim 2 wherein the isostatic pressure is from about 100,000 pounds per square inch (688 megapascals) to about 160,000 pounds per square inch (1100 megapascals).

11. The method of claim 2 wherein the time is from about 0.1 second to about 120 minutes.

12. The method of claim 2 wherein the time is from about one second to about one minute.

13. The method of claim 2 further comprising two additional, sequential steps, a first additional step wherein the densified article is heated in a gaseous atmosphere at a temperature greater than or equal to that of step a for a period of time within a range of from about one hour and about five days, the gaseous atmosphere being inert for non-noble metals, and the second additional step comprising a further heat treatment in an oxygen-containing atmosphere at a temperature high enough to allow uptake of oxygen by the superconducting oxide, but low enough to substantially preclude oxidation of the metal, for a period of time sufficient to attain superconductivity and cause the article to have zero resistance to current flow.

14. The method of claim 13 wherein the temperature for the further heat treatment is from about 350° C. to about 500° C.

15. The method of claim 2 further comprising a step wherein the densified article is subjected to a heat treatment in an oxygen-containing atmosphere to a temperature high enough to allow uptake of oxygen by the superconducting oxide but low enough to substantially preclude oxidation of the metal and maintained at that temperature for a period of time sufficient to attain superconductivity.

16. The method of claim 15 wherein the temperature for the further heat treatment is from about 350° C. to about 500° C.

17. The method of claim 2 wherein the powdered admixture contains from about 20 to about 95 percent by volume of superconducting oxide and from about 5 to about 80 percent by volume of metal, both percentages being based upon admixture volume 18. The method of claim 2 wherein the superconducting oxide is a high temperature superconducting oxide containing copper-oxygen sheets and having an average oxidation number of copper greater than +2.

19. The method of claim 2 wherein the superconducting oxide is a high temperature superconducting oxide selected from the group consisting of $YBa_2Cu_3O_{7-\delta}$, $ReBa_2Cu_3O_{7-\delta}$, $La_{2-X}Ba_XCuO_{4-\delta}$, $La_{2-X}Sr_XCuO_{4-\delta}$, $Bi_{2-M}Pb_MSr_{2-N}Ca_{K-1-P}Cu_{K-W}O_{2K+4+Y}$, $Tl_JBa_{2-N}Ca_{K-1-P}Cu_{K-W}O_{2K+J+2+Y}$, $Tl_aPb_bCa_cSr_dCu_eO_{2(b+c+d+e)+3a+\delta}$, $YBa_2Cu_4O_{8-\delta}$, and $Pb_2Sr_2Re_{1-Q}Ae_QCu_3O_{8+\delta}$, wherein $\delta$, N, M, P and W are real numbers greater than or equal to zero and less than or equal to one, Y is a real number greater than zero and less than or equal to 3K, Q is a real number greater than zero and less than one, J is one or two, K is a positive integer greater than or equal to one and less than or equal to five, X is greater than zero but less than 0.4, a is from about 0.3 to about 1, b is from about 0.1 to about 1.5, c is from about 1 to about 4, d is from about 1 to about 3, e is from about 1 to about 5, Ae is calcium or strontium and Re is selected from the group consisting of lanthanum, neodymium, samarium, europium, gadolinium, terbium, dysprosium, holmium, erbium, thulium, ytterbium and lutetium.

20. The method of claim 19 wherein K is two, three or four where the superconducting oxide contains thallium or two or three where the superconducting oxide contains bismuth.

21. The method of claim 2 wherein the superconducting oxide is a high temperature superconducting oxide selected from the group consisting of $YBa_2Cu_3O_{7-\delta}$ and $Bi_{2-M}Pb_MSr_{2-N}Ca_{K-1-P}Cu_{K-W}O_{2K+4+Y}$.

22. The method of claim 2 wherein the metal is an element selected from the group consisting of Atomic Numbers 4, 12, 13, 22–30, 40–50, 72–83, alloys of one such element with minor amounts of non-metallic elements, alloys of two or more of such elements and alloys of at least one of such elements with lithium.

23. The method of claim 2 wherein the metal is copper, nickel, cobalt, iron, tungsten or chromium.

24. The method of claim 2 wherein the metal is bronze, brass, stainless steel, an alloy of nickel and chromium, or an alloy of nickel, chromium, iron and up to 0.5 volume percent of one or more of manganese and copper.

25. The method of claim 2 wherein the metal is aluminum, manganese or niobium.

* * * * *